United States Patent
Lee et al.

(10) Patent No.: US 7,340,560 B2
(45) Date of Patent: Mar. 4, 2008

(54) METHODS AND DEVICES FOR ACCESSING A MEMORY USING MULTIPLE SEPARATE ADDRESS MAPPED TEMPORARY STORAGE AREAS

(75) Inventors: Byong-kwon Lee, Gyeonggi-do (KR); Cheol-Shin Kwak, Seoul (KR); Chul-sung Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 442 days.

(21) Appl. No.: 10/896,719

(22) Filed: Jul. 22, 2004

(65) Prior Publication Data
US 2005/0018521 A1    Jan. 27, 2005

(30) Foreign Application Priority Data
Jul. 24, 2003    (KR)    .................... 10-2003-0051120

(51) Int. Cl.
*G06F 12/00*    (2006.01)
(52) U.S. Cl. ........................ 711/104; 711/168
(58) Field of Classification Search ............. None
See application file for complete search history.

(56) References Cited

U.S. PATENT DOCUMENTS

| | | | |
|---|---|---|---|
| 6,816,955 B1 * | 11/2004 | Raza et al. ............... | 711/168 |
| 6,826,088 B2 * | 11/2004 | Sohn et al. ............ | 365/189.04 |
| 6,832,294 B2 * | 12/2004 | Wicki et al. .............. | 711/128 |
| 6,880,056 B2 * | 4/2005 | Kootstra .................... | 711/168 |
| 6,891,772 B2 * | 5/2005 | Demone ................ | 365/230.04 |
| 6,912,628 B2 * | 6/2005 | Wicki et al. ............... | 711/156 |
| 7,193,903 B2 * | 3/2007 | Sohn et al. ............ | 365/189.04 |
| 2003/0188088 A1 * | 10/2003 | Kootstra .................... | 711/105 |
| 2003/0198119 A1 * | 10/2003 | Jones et al. ............ | 365/230.03 |
| 2003/0200395 A1 * | 10/2003 | Wicki et al. ................ | 711/128 |
| 2003/0200404 A1 * | 10/2003 | Wicki et al. ................ | 711/156 |
| 2004/0141399 A1 * | 7/2004 | Sohn et al. ............ | 365/230.03 |
| 2004/0208064 A1 * | 10/2004 | Sohn et al. ............ | 365/189.04 |
| 2004/0210733 A1 * | 10/2004 | Sohn et al. ................ | 711/168 |
| 2005/0180246 A1 * | 8/2005 | Demone ................ | 365/230.03 |
| 2005/0180249 A1 * | 8/2005 | Kootstra ................ | 365/230.03 |

FOREIGN PATENT DOCUMENTS

JP    10-241360    9/1998
JP    2001-319477    11/2001

OTHER PUBLICATIONS

Notice to Submit a Response for Korean patent application No. 10-2003-0051120 mailed on May 30, 2005.

* cited by examiner

*Primary Examiner*—Kevin Verbrugge
(74) *Attorney, Agent, or Firm*—Myers Bigel Sibley & Sajovec, P.A.

(57) ABSTRACT

A method of accessing an integrated circuit memory device can include reading from an address in a first memory sub-block during a first clock cycle. The address of a first data memory block address mapped to the first memory sub-block can be written to during the first clock cycle. The address of a second data memory block address mapped can be written to the second memory sub-block during a second clock cycle immediately subsequent in time to the first clock cycle. Related device are disclosed.

23 Claims, 5 Drawing Sheets

METHODS AND DEVICES FOR ACCESSING A MEMORY USING MULTIPLE SEPARATE ADDRESS MAPPED TEMPORARY STORAGE AREAS

CROSS-REFERENCE TO RELATED APPLICATION

This application claims the priority of Korean Patent Application No. 2003-51120, filed on Jul. 24, 2003, in the Korean Intellectual Property Office, the disclosure of which is incorporated by reference herein in its entirety.

FIELD OF THE INVENTION

The invention relates to integrated circuit single/dual data rate memory devices and methods of operating the same.

BACKGROUND

A synchronous random access memory (SRAM) can transmit/receive read/write data once per clock period. A double data rate SRAM may be able to transmit data at twice the rate of an SRAM by transmitting data on the rising and falling edges of the clock (rather than on only one edge). However, in some memory devices, data is input/output via a common (e.g., a single) pin. When a common input/output port (common I/O) is used, the input and output operations of the data may not be easily controlled independently of one another, thus limiting the rate at which data can be input/output to/from the device.

Accordingly, it is known to use separate I/O for devices such as an SRAM so that an input pin and an output pin are separated from each other so that the input/output of the data can be controlled independently. Memory devices having the separated input/output pins may be capable of receiving a read command/address and a write command/address (with write data) in one period of the clock, thus increasing the device's operating speed.

However, even if the memory device has the separate I/O, when the memory device receives the read command/address and the write command/address/data, access to the memory cell region may be performed twice in order to perform the read operation and the write operation in one clock period, which may require the word line to be cycled twice during the clock period.

Figure 1:
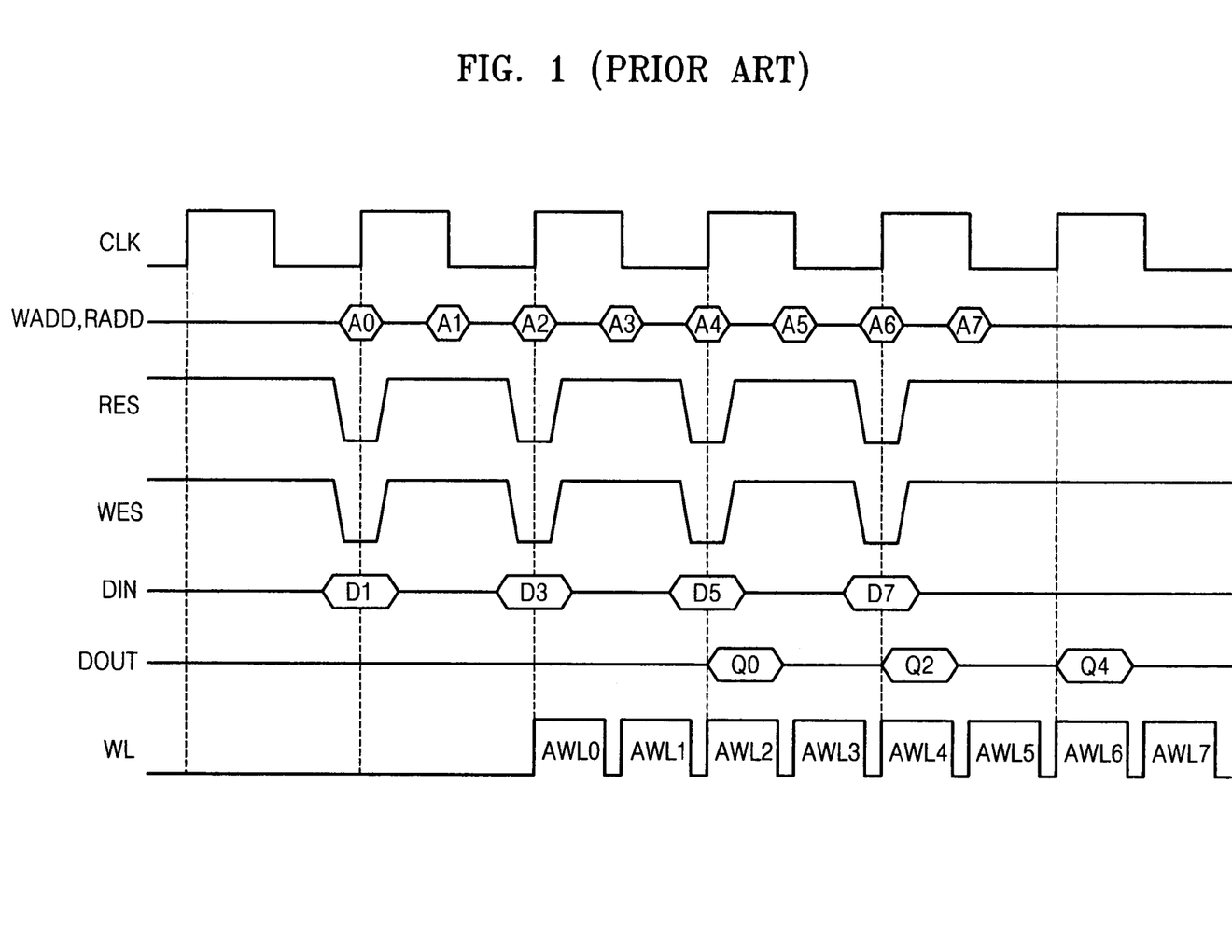
FIG. 1 is a timing view for describing operations of a memory device having separate input/output ports according to the prior art.

FIG. 1 is a timing view of operations of a conventional memory device having separate I/O. A relation between the address and the word line or a latency of the input data or the output data can be changed by construction of the memory device, (which is not shown or reflected in FIG. 1).

Referring to FIG. 1, a write address (WADD) and a read address (RADD) are input during one period of a clock signal (CLK). Addresses RADDs A0, A2, A4, and A6 are input on a rising edge of the CLK. Addresses WADDs A1, A3, A5, and A7 input on a falling edge of the CLK. RES and WES represent a read selection signal and a write selection signal for selecting RADD and WADD, respectively.

The word line AWL0 is activated by RADD A0, and the data Q0 is output corresponding to the word line AWL0. Also, when the word line AWL1 is activated corresponding to WADD A1, the input data D1 is input. The word line AWL0 (for a read operation) and the word line AWL1 (for a write operation) are both activated during the one period of the CLK. Therefore, the period of CLK may not be less than a total activation time of the two word lines, which may limit the operating speed of the integrated circuit.

Accordingly, data transmission speeds may be increased by separating the data transmission path, in the same manner that separate I/O is used to increase the operating speed of the integrated circuit, and may be further increased by using both the rising and the falling edges of the clock signal to control data transmission. However, according to the above method, the read and write operations may not be performed simultaneously in the memory cell region, which may limit the operating speed.

It is known to use a temporary memory for the read and the write operations so that the memory cell region may be accessed simultaneously, thus increasing the operational speed of the integrated circuit. In some conventional integrated circuits, a temporary memory having a faster operational speed than that of a main memory is added, a predetermined part of the main memory is mapped to the temporary memory, and the read and write operations can be performed using the temporary memory.

For example, for read operations, if the desired data is stored in the temporary memory, the data is read from the temporary memory, and if the desired data is not in the temporary memory, the data is read from the main memory and new data is updated in the temporary memory. For write operations, data from an external source is written to the temporary memory. When there is no space to write data in the temporary memory, data which is not used frequently can be transferred to the main memory.

The above method is characteristic in cases where addressing proceeds linearly such that a next address is incremental over a recently used address. However, in a case where the address generation is random, the operational speed may be lowered greatly. Alternatively, the operational speed may also be reduced if the memory access involves multiple memory regions across a plurality of bytes. Also, if write/read operations are to be performed simultaneously to the main memory, a temporary memory may be needed if, for example, the write/read addresses are within the same row.

In addition, the data stored in the temporary memory can be transferred to the main memory unless the subsequent write and read operations are directed to regions of memory where simultaneous access is not allowed. Here, the temporary memory is the same size as the minimum size of a space where the write and read operations may not be performed simultaneously in the main memory. Also, a tag memory that stores an address in the main memory (in which the data stored in the temporary memory will be stored), is disposed to increase the operational speed of the integrated circuit.

Figure 2:
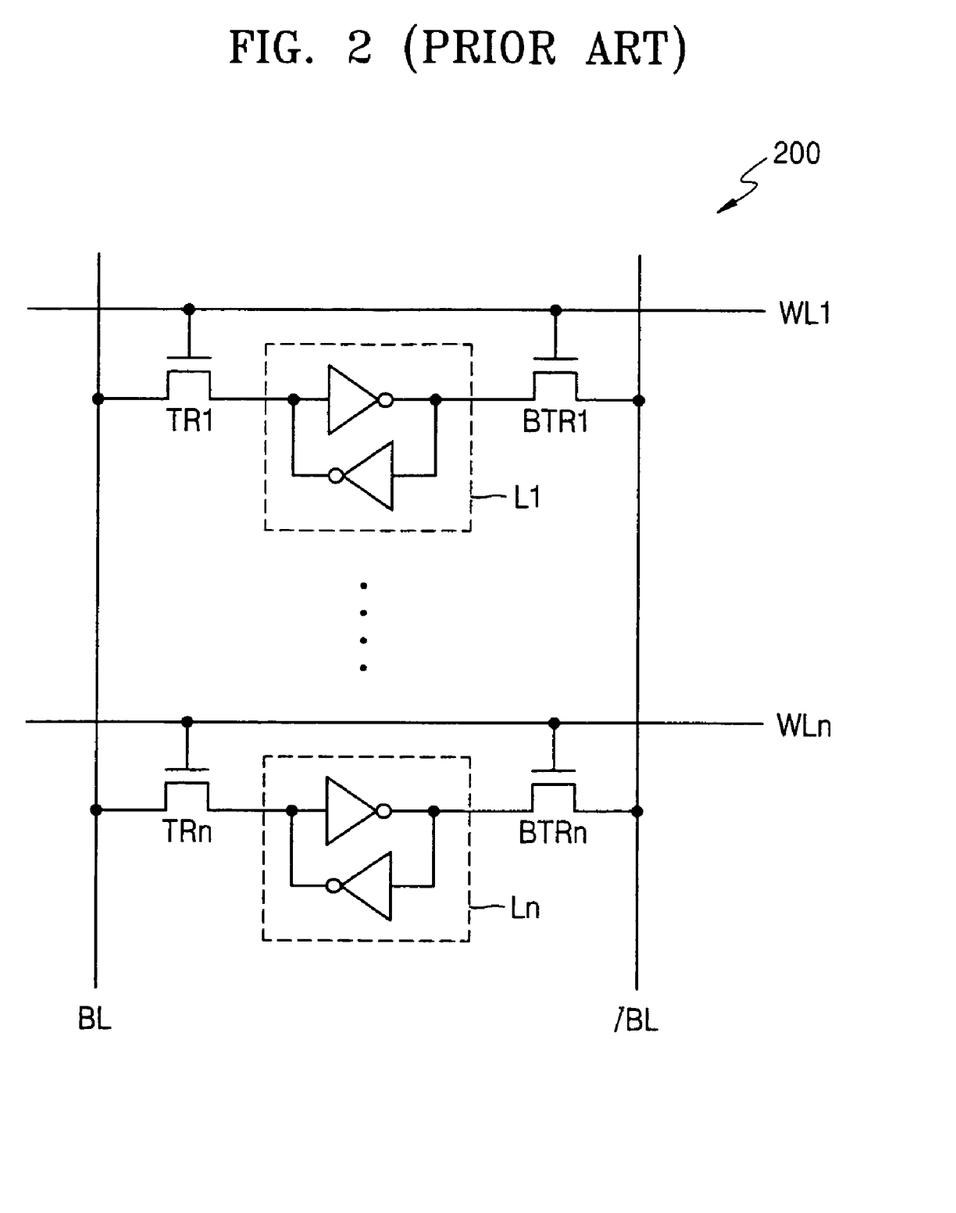
FIG. 2 is a circuit diagram for describing problems associated with simultaneous write/read operations according to the prior art.

FIG. 2 is a circuit diagram for describing some problems associated with simultaneous write and read operations. FIG. 2 shows a structure of a static random access memory (SRAM). The main memory of the SRAM has a matrix structure for storing the data effectively, and has a minimum area on which the write and read operations cannot be performed simultaneously. The minimum area is shown in FIG. 2.

A first latch L1, in which data is stored, is connected between a pair of bit lines BL and/BL using transistors TR1 and BTR1. It is assumed that data "1" is stored on a left side of the first latch L1 and data "0" is stored on a right side of the first latch L1. It is also assumed that data "0" is stored on a left side of an $n^{th}$ latch Ln and data "1" is stored on a right side of the $n^{th}$ latch Ln. When the first word line WL1 and an nth word line WLn are activated simultaneously, a crash may occur between the data output through the pair of bit lines BL and/BL (because the data values are different).

Therefore, two latches may not be accessed in this minimum area of the main memory shown in FIG. 2 simultaneously.

Figure 3:
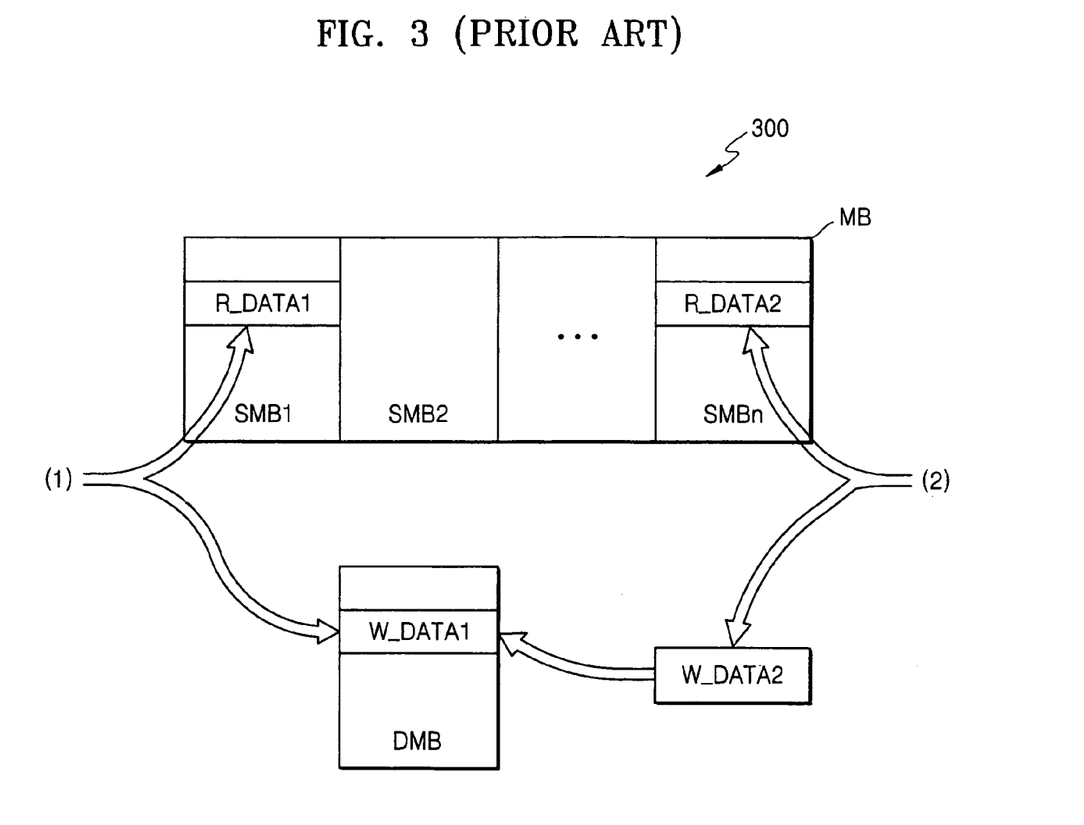
FIG. 3 is a view for describing problems of a method using a temporary memory.

FIG. 3 is a view for describing problems of a second method using the temporary memory. As described in the main memory structure of FIG. 2, a temporary memory (or data memory block) DMB is used to address the problem where the write and read operations cannot be performed simultaneously in the minimum areas SMB1, SMB2, . . . , SMBn of the main memory MB.

That is, when the write address and the read address are received so that the write and read operations are to be performed simultaneously in a sub-memory block SMB1, the read operation is performed in the first sub-memory block SMB1 to read first read data R_DATA1 and the write operation is performed in the temporary memory (DMB) to write first write data W_DATA1 (1).

If a subsequent write and read is directed to a different sub-memory block (for example, nth sub-memory block SMBn) at an address in the same row as that of the first sub-memory block SMB1 on which the read operation is previously performed, the read operation of second read data R_DATA1 can be performed in the nth sub-memory block SMBn. However, the second write operation W_DATA2 cannot be performed in the data memory block (DMB) (2), since the first write data W_DATA1 is stored in the DMB and the second write data W_DATA2 cannot be stored in the DMB.

If a tag memory is used in conjunction with the structure discussed above, the tag memory is searched for the received address, to determine whether the new data is in the DMB or in the sub-memory blocks SMB1, SMB2, . . . , SMBn, the operational speed of the integrated circuit can be further increased. Although the tag memory used with the DMB may increase the operational speed, there may still exist a need for further increases in operating speed.

SUMMARY

Embodiments according to the invention can provide methods and devices for accessing a memory using multiple separate address mapped temporary storage areas. Pursuant to these embodiments, a method of accessing an integrated circuit memory device can include reading from an address in a first memory sub-block during a first clock cycle. The address of a first data memory block address mapped to the first memory sub-block can be written to during the first clock cycle. The address of a second data memory block address mapped can be written to the second memory sub-block during a second clock cycle immediately subsequent in time to the first clock cycle.

In some embodiments according to the invention, writing to the address of a first data memory block address can further include updating a tag memory associated with the first and second data memory blocks to reflect that valid data is stored in the first or second data memory block associated with the address. In some embodiments according to the invention, updating can further include updating a searchable write tag memory associated with the first and second data memory blocks to reflect that valid data is stored in the first or second data memory block associated with the address.

In some embodiments according to the invention, the method can further include searching a read tag memory associated with the first and second data memory to determine whether a read to the address should occur in the first or second data memory blocks or in a memory including the first memory sub-block. In some embodiments according to the invention, updating the searchable write tag memory and searching the read tag memory are performed simultaneously.

In some embodiments according to the invention, the method can further include reading from the second memory sub-block during the second clock cycle, wherein the first and second memory sub-blocks are simultaneously accessible for read or write operations. In some embodiments according to the invention, the method can further include transferring data from the address of the first data memory block to the first memory sub-block simultaneous with reading from the second memory sub-block.

In some embodiments according to the invention, the method can further include updating the tag memory to reflect that the data in the first data memory block is invalid after writing the data to the first memory sub-block and updating the tag memory to reflect that data written to the second data memory block is valid. In some embodiments according to the invention, the first and second memory sub-blocks can be first and second separately accessible sub-blocks of the memory device.

In some embodiments according to the invention, the first and second data memory blocks can be first and second separately accessible portions of the memory. In some embodiments according to the invention, the first data memory block can be a direct address mapped memory, a set associative address mapped memory, or a fully associative address mapped memory. In some embodiments according to the invention, the integrated circuit memory device can be a synchronous dual data rate random access memory device.

In some embodiments according to the invention, an integrated circuit memory device can include a main memory including a plurality of separately simultaneously accessible sub-memory blocks. A first data memory block can be address mapped to a first of the plurality of sub-memory blocks configured to store data directed to an address of the first of the plurality of sub-memory blocks responsive to a read directed to the address of the first of the plurality of sub-memory blocks in a first clock cycle. A second data memory block can be address mapped to a second of the plurality of sub-memory blocks configured to store data directed to the address in the second of the plurality of sub-memory blocks during a second clock cycle immediately subsequent to the first clock cycle if the first data memory block contains valid data.

DETAILED DESCRIPTION OF EMBODIMENTS ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
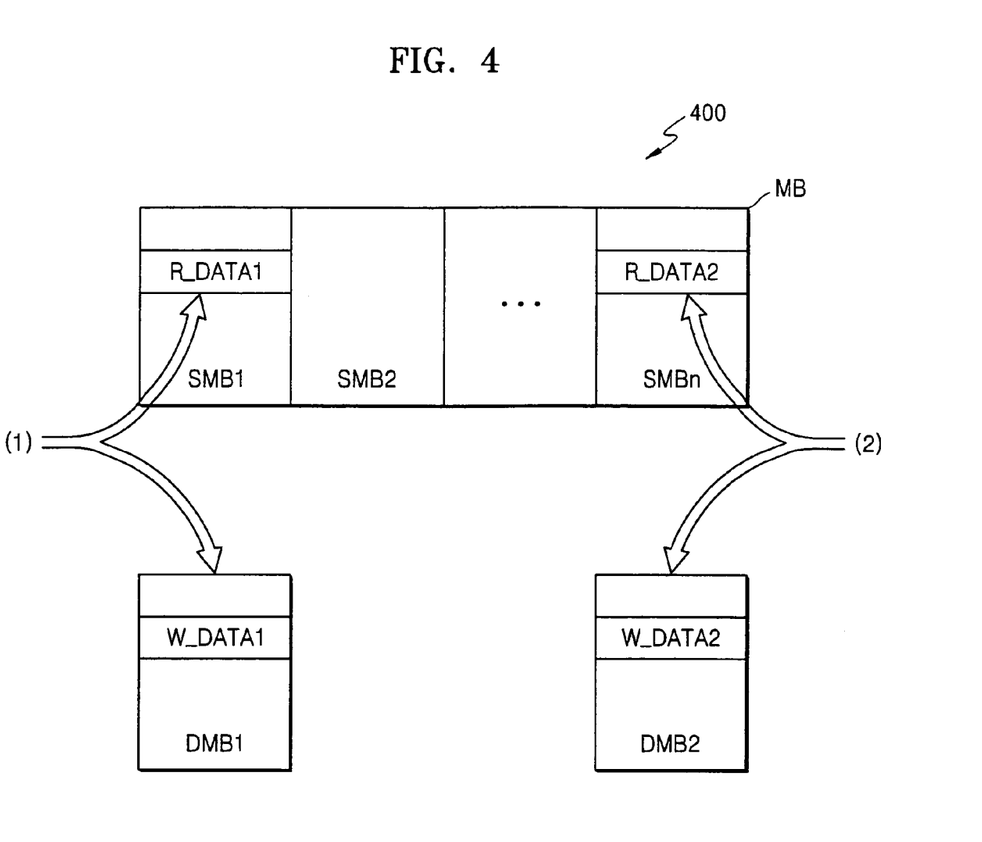
FIG. 4 is a view of structures of a main memory and a data memory block in an integrated circuit according to some embodiments of the invention.

FIG. 4 is a view of structures of a main memory and a data memory block (DMB) of an integrated circuit according to some embodiments of the invention. Referring FIG. 4, the integrated circuit 400 includes a main memory MB including a plurality of sub-memory blocks SMB1, SMB2, ..., SMBn and data memory blocks DMB1 and DMB2. The sub-memories SMB1, SMB1, ..., or SMBn represent a minimum memory area in which a write operation and a read operation cannot be performed simultaneously. In other words, in some embodiments according to the invention, simultaneous reads and writes may not be performed within any of the sub-memories SMB1, SMB1, ..., or SMBn. Also, reads and writes to the integrated circuit 400 may be at a single data rate (SDR) or a double data rate (DDR).

Each of the data memory blocks DMB1 and DMB2 is the same size as the sub-memory blocks. The integrated circuit 400 of the invention includes a plurality of data memory blocks DMB1 and DMB2, whereas the integrated circuit 300 shown in FIG. 3 has a single data memory block (DMB). Therefore, the problems discussed above regarding when data is written continuously to the same address of one data memory block DMB2 may be alleviated. It will be understood that although two data memory blocks DMB1 and DMB2 are shown in FIG. 4, in some embodiments according to the invention, more data memory blocks may be used.

Operations of the integrated circuit 400 will be described in more detail with reference to FIG. 4. Write or read operations are performed using the data memory blocks DMB1 and DMB2 when the write/read addresses indicate that both operations are directed to the same address in the same sub-memory block. For example, when the write address and the read address simultaneously indicate the write/read operations are directed to the first sub-memory block SMB1, the first sub-memory block SMB1 performs the read operation whereas the first data memory block DMB1 performs the write operation (1). Therefore, the first write data W_DATA1 is stored in the first data memory block DMB1.

When the write address and the read address input after being synchronized with a subsequent clock signal (not shown) indicate an nth sub-memory block SMBn, it is assumed that these addresses indicate the same address as that of the first memory block SMB1 in which the read operation is performed. In other words, when a write/read operation (addressed to the nth sub-memory block SMBn) is received during an immediately subsequent clock cycle, it is assumed that the address specifies the same address with the sub-memory block as that used for the previous operation. Accordingly, a conventional integrated circuit 300 may not be able to store the second write data W_DATA2 since the first write data W_DATA1 is already stored in the first data-memory block DMB11 (see FIG. 3).

However, in some embodiments according to the invention, the integrated circuit 400 performs the read operation corresponding to the read address in the nth sub-memory block SMBn, and performs the write operation to the write address in the second data memory block DMB2 (2). The first write data W_DATA1 stored in the first data memory block DMB1 is transferred to the corresponding first sub-memory block SMB1 while the read operation is performed in the nth sub-memory block SMBn, and while the write operation is performed to the second data memory block DMB2.

Moreover, if a further subsequent read address and the write address input after being synchronized with the subsequent clock signal indicates the same address, the further write operation can be performed to the first data memory block DMB1 (as the data previously stored therein has been transferred to the first sub-memory block SMB1 as discussed above). Therefore, generally, when data is being written to one data memory block, data stored in the other data memory block can be transferred to the corresponding sub-memory block, thus effective data is always in one data memory block.

In some embodiments according to the invention, the data memory blocks DMB1 and DMB2 are directly mapped to the sub-memory block. That is, since respective data memory blocks DMB1 and DMB2 and respective sub-memory blocks SMB1, SMB2, ..., SMBn are the same size, the location where the data is stored in the sub-memory blocks SMB1, SMB2, ..., SMBn can be accessed using the same address that specifies the location of the data in stored in the data memory blocks DMB1 and DMB2. In some embodiments according to the invention, the data memory blocks DMB1 and DMB2 may be set associative mapped or fully associative mapped to the sub-memory blocks.

Figure 5:
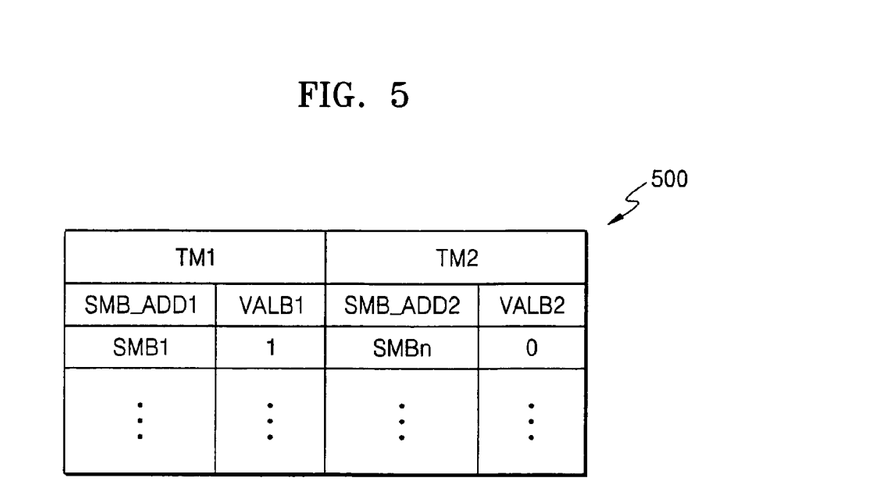
FIG. 5 is a view of a structure of a tag memory for use with a data memory block structure.

FIG. 5 is a view of a structure of a tag memory storing method. The tag memories TM1 and TM2 include data memory addresses SMB_ADD1 and SMB_ADD2 that represent a sub-memory block, which corresponds to the data stored in the data memory block, and effective decision information (or valid information) VALB1 and VALB2 for deciding whether the data stored in the data memory block is effective (or valid).

In an embodiment according to the invention, such as the integrated circuit 400 shown in FIG. 4, includes two data memory blocks DMB1 and DMB2, two tag memories TM1 and TM2 may be used according to the tag storing method discussed above as shown in FIG. 5.

Figure 6:
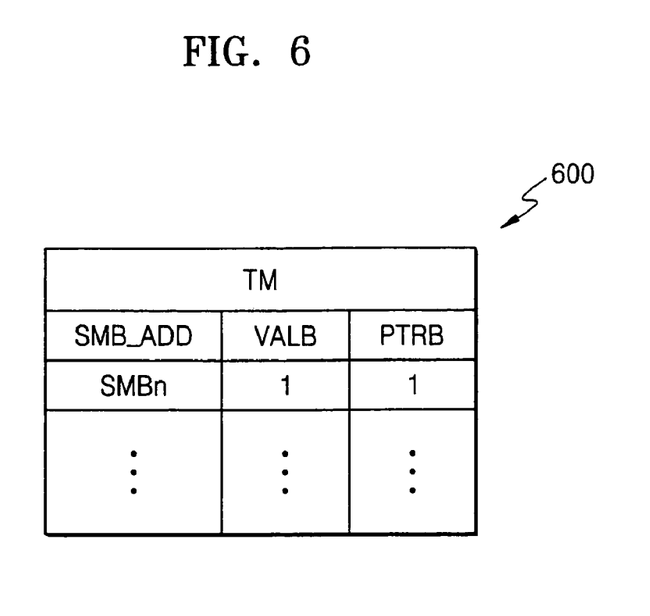
FIG. 6 is a view of a tag memory structure according to some embodiments of the invention.

In contrast to the structures shown in FIG. 5, in some embodiments according to the invention, one tag memory is used in the integrated circuit 400 as illustrated, for example, in FIG. 6. In particular, FIG. 6 is a view of a structure of the tag memory according to some embodiments of the invention. The tag memory 600 according to the invention includes a data memory address SMB_ADD, effective decision information (or "valid") VALB, and a pointer bit PTRB.

In some embodiments according to the invention, the data memory address SMB_ADD represents the sub-memory block which corresponds to the data stored in the data memory block. The data memory address SMB_ADD represents the sub-memory block in which the data stored in the data memory block should be stored and then becomes the address of the sub-memory block corresponding to the stored data.

In some embodiments according to the invention, the effective decision information (or "valid") VALB is information for deciding whether the data stored in the data memory block is effective. The effective decision information VALB is 1 bit size. In addition, when the effective decision information VALB is "1," it is effective, and when the effective decision information VALB is "0", it means ineffective. However, it is not limited to the above and can be set otherwise.

As used herein, the terms "valid" and "invalid" collectively refer to the state of the data associated with the valid information as being either accurate or inaccurate. For example, in a case where the data written to a DMB, has not been transferred to the main memory, the data in the DMB can be tagged as "valid," which indicates that the data can be used (i.e., can be read) and may not be overwritten. In contrast, if the data written to the DMB, has been transferred to the main memory, the data in the DMB can be tagged as "invalid," which indicates that the data should not be used (i.e., should not be read) and may be overwritten (by, for example, a subsequent write operation). Furthermore, an "invalid" indicator may control that data is read from the main memory rather than the DMB.

In some embodiments according to the invention, the pointer bit PTRB is a bit for deciding whether the effective data is stored in the first data memory block DMB1 or the second data memory block DMB2 shown in FIG. 4. As described above, only one of data stored in the same address areas of the first data memory block DMB1 and the second data memory block DMB2 is effective, since the data stored in the address of one data memory block is transferred to the main memory MB in a case where the data is stored in the same address of another data memory block.

Therefore, the pointer bit PTRB can indicate whether the effective data is stored in the first data memory block DMB1 or in the second data memory block DMB2 is added in the tag memory TM to operate the integrated circuit 400 with one tag memory. In some embodiments according to the invention, the pointer bit PTRB is of a 1-bit size.

For example, when the pointer bit PTRB is "0," the effective data is stored in the first data memory block DMB1, and when the pointer bit PTRB is "1," the effective data is stored in the second data memory block DMB2. If the pointer bit PTRB is of 2-bits size or larger, the pointer bit PTRB can be applied to a case where there are two or more data memory blocks. Therefore, the size of the integrated circuit 400 can be reduced.

Figure 7:
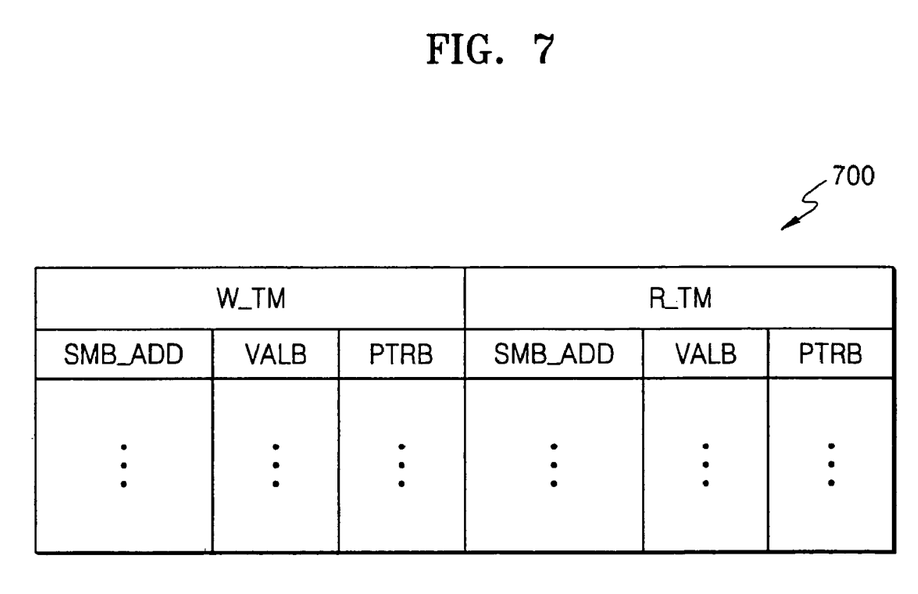
FIG. 7 is a view of a tag memory structure according to some embodiments of the invention.

FIG. 7 is a view of a tag memory according to some embodiments of the invention. Referring to FIG. 7, the tag memory 700 includes a write tag memory unit W_TM and a read tag memory unit R_TM. In some embodiments according to the invention, the write tag memory unit W_TM is searched to determine whether the write operation will be performed to the sub-memory block or to the data memory block by comparing the input write address with the data memory addresses SMB_ADD stored therein.

In some embodiments according to the invention, the read tag memory unit R_TM is searched to determined whether the read operation will be performed in the sub-memory block or in the data memory block by comparing the input read address with the data memory addresses SMB_ADD stored therein.

In some embodiments according to the invention, the write tag memory unit W_TM and the read tag memory unit R_TM may be searched simultaneously with the different addresses corresponding to the write and read addresses. The tag memory can generally search the contents of the tag memory corresponding to the read address (operation 1) and search the contents of the tag memory corresponding to the write address (operation 2). Searching the contents means searching for an entry (or value) stored in the tag memory that matches the address for the write or read operation to be performed.

Based on whether a match occurs on the search of the tag memory, the main memory or the data memory block (operation 3) can be accessed. If the address is the same as the input write address and the read address is stored in the data memory address, the tag memory decides whether the data stored in the data memory block is effective by referring to the effective decision information VALB, since whether the write operation and read operation are performed in the main memory or in the data memory block is decided according to the effectiveness of the data. In other words, in some embodiments according to the invention, if the search of the tag memory results in a match, the effective decision information VALB is used to control whether the write/read will be performed in the main memory or in the DMB.

If the data is written to the DMB, the changed contents of the data memory block is updated in the tag memory in a case where the tag memory accesses the data memory block (operation 4). In some embodiments according to the invention, the above operations can performed in a single clock cycle, which may limit the operational speed of the integrated circuit 400.

In some embodiments according to the invention, the tag memory 700 shown in FIG. 7 may further increase the operational speed of the integrated circuit. The tag memory 700 can be divided into the write tag memory unit W_TM corresponding to the write address and the read tag memory unit R_TM corresponding to the read address so that the first and second searching operations can be performed simultaneously.

The input read address is compared with the data memory address SMB_ADD in the read tag memory unit R_TM, and the input write address is compared with the data memory address SMB_ADD in the write tag memory unit W_TM. The two comparison operations are performed simultaneously, thus the above first and second operations can be performed simultaneously.

Since the operations of the write tag memory unit W_TM and the read tag memory unit R_TM are performed simultaneously, a third operation can be performed simultaneously. The fourth operation does not need to be performed simultaneously, but can be performed before an operation according to a subsequent command is performed.

If there is no time to transfer the data stored in the data memory block to the main memory, a memory block set including two data memory blocks is disposed adjacent to the corresponding main memory, then a plurality of memory block sets are used to increase the operational speed of the integrated circuit.

As described above, according to the integrated circuit and data storing method of the integrated circuit of the invention, the operational speed of the integrated circuit can increase using a plurality of temporary memories and corresponding tag memory structures.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed:

1. A method of accessing an integrated circuit memory device comprising:
    reading from an address in a first memory sub-block during a first clock cycle;
    writing to the address of a first data memory block which is mapped to the first memory sub-block during the first clock cycle; and
    writing to the address of a second data memory block which is mapped to a second memory sub-block during a second clock cycle immediately subsequent in time to the first clock cycle wherein data is transferred from the second data memory block to the second memory sub-block during the first clock cycle substantially simultaneous with the reading of the address in the first memory sub-block and with the writing of the address of the first data memory block and before the writing of the address of the second data memory block during the second clock cycle.

2. A method according to claim 1 wherein writing to the address of a first data memory block address further comprises:
    updating a tag memory associated with the first and second data memory blocks to reflect that valid data is stored in the first or second data memory block associated with the address.

3. A method according to claim 2 wherein updating further comprises:
    updating a searchable write tag memory associated with the first and second data memory blocks to reflect that valid data is stored in the first or second data memory block associated with the address.

4. A method according to claim 3 further comprising:
    searching a read tag memory associated with the first and second data memory to determine whether a read to the address should occur in the first or second data memory blocks or in a memory including the first memory sub-block.

5. A method according to claim 4 wherein updating the searchable write tag memory and searching the read tag memory are performed simultaneously.

6. A method according to claim 2 further comprising:
    reading from the second memory sub-block during the second clock cycle, wherein the first and second memory sub-blocks are simultaneously accessible for read or write operations.

7. A method according to claim 6 further comprising:
    transferring data from the address of the first data memory block to the first memory sub-block simultaneous with reading from the second memory sub-block.

8. A method according to claim 7 further comprising:
    updating the tag memory to reflect that the data in the first data memory block is invalid after writing the data to the first memory sub-block; and
    updating the tag memory to reflect that data written to the second data memory block is valid.

9. A method according to claim 2 wherein the first and second memory sub-blocks comprise first and second separately accessible sub-blocks of the memory device.

10. A method according to claim 1 wherein the first and second data memory blocks comprise first and second separately accessible portions of the memory.

11. A method according to claim 1 wherein the first data memory block comprises a direct address mapped memory, a set associative address mapped memory, or a fully associative address mapped memory.

12. A method according to claim 1 wherein the integrated circuit memory device comprises a synchronous dual data rate random access memory device.

13. An integrated circuit memory device comprising:
    means for reading from an address in a first memory sub-block during a first clock cycle;
    means for writing to the address of a first data memory block which is mapped to the first memory sub-block during the first clock cycle; and
    means for writing to the address of a second data memory block which is mapped to a second memory sub-block during a second clock cycle immediately subsequent in time to the first clock cycle wherein data is transferred from the second data memory block to the second memory sub-block during the first clock cycle substantially simultaneous with the reading of the address in the first memory sub-block and with the writing of the address of the first data memory block and before the writing of the address of the second data memory block during the second clock cycle.

14. A device according to claim 13 wherein means for writing to the address of a first data memory block address further comprises:
    means for updating a tag memory associated with the first and second data memory blocks to reflect that valid data is stored in the first or second data memory block associated with the address.

15. A device according to claim 14 wherein means for updating further comprises:
    means for updating a searchable write tag memory associated with the first and second data memory blocks to reflect that valid data is stored in the first or second data memory block associated with the address.

16. A device according to claim 15 further comprising:
    means for searching a read tag memory associated with the first and second data memory to determine whether a read to the address should occur in the first or second data memory blocks or in a memory including the first memory sub-block.

17. An integrated circuit memory device comprising:

a main memory including a plurality of separately simultaneously accessible sub-memory blocks; and a first data memory block which is mapped to a first of the plurality of sub-memory blocks configured to store data directed to an address of the first of the plurality of sub-memory blocks responsive to a read directed to the address of the first of the plurality of sub memory blocks in a first clock cycle; and a second data memory block which is mapped to a second of the plurality of sub-memory blocks configured to store data directed to the address in the second of the plurality of sub-memory blocks during a second clock cycle immediately subsequent to the first clock cycle if the first data memory block contains valid data wherein data is transferred from the second data memory block to the second memory sub-block during the first clock cycle substantially simultaneous with the reading of the address in the first memory sub-block and with the writing of the address of the first data memory block and before the writing of the address of the second data memory block during the second clock cycle.

18. A device according to claim 17 further comprising:

a tag memory associated with the first and second data memory blocks and configured to indicate which of the first and second data memory blocks contains valid data unwritten to the first or second of the plurality of sub-memory blocks.

19. A device according to claim 18 wherein the tag memory further comprises:

a write tag memory configured to reflect whether valid data is stored in the first or second data memory block associated with the address; and a read tag memory configured to determine whether a read to the address should occur in the first or second data memory blocks or in a memory including the first memory sub-block.

20. A device according to claim 17 wherein the first and second memory sub-blocks comprise first and second separately accessible sub-blocks of the memory device.

21. A device according to claim 17 wherein the first and second data memory blocks comprise first and second separately accessible portions of the memory.

22. A device according to claim 17 wherein the first data memory block comprises a direct address mapped memory, a set associative address mapped memory, or a fully associative address mapped memory.

23. A device according to claim 17 wherein the integrated circuit memory device comprises a synchronous dual data rate random access memory device.

* * * * *